US 6,600,792 B2

(12) United States Patent
Antonio et al.

(10) Patent No.: US 6,600,792 B2
(45) Date of Patent: *Jul. 29, 2003

(54) PREDISTORTION TECHNIQUE FOR HIGH POWER AMPLIFIERS

(75) Inventors: Franklin P. Antonio, Del Mar, CA (US); Walid Hamdy, San Diego, CA (US); Nitin Kasturi, Los Gatos, CA (US); Christopher C. Riddle, San Diego, CA (US); David P. Oses, San Diego, CA (US)

(73) Assignee: Qualcomm Incorporated, San Diego, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/105,532

(22) Filed: Jun. 26, 1998

(65) Prior Publication Data

US 2002/0101937 A1 Aug. 1, 2002

(51) Int. Cl.[7] .............................................. H04L 25/49
(52) U.S. Cl. ........................ 375/297; 330/149; 455/126
(58) Field of Search ................................ 375/278, 284, 375/285, 296, 297; 330/75, 149; 458/63, 126

(56) References Cited

U.S. PATENT DOCUMENTS

| 4,291,277 A | | 9/1981 | Davis et al. ................ 330/149 |
| 4,500,919 A | * | 2/1985 | Schreiber ................... 358/518 |
| 4,700,151 A | | 10/1987 | Nagata ......................... 332/18 |
| 5,148,448 A | | 9/1992 | Karam et al. ................. 375/60 |
| 5,164,678 A | | 11/1992 | Puri et al. .................. 330/149 |
| 5,486,789 A | | 1/1996 | Palandech et al. .......... 330/149 |
| 5,489,879 A | | 2/1996 | English ....................... 332/103 |
| 5,574,992 A | | 11/1996 | Cygan et al. ................ 455/126 |
| 5,694,433 A | | 12/1997 | Dent ........................... 375/297 |
| 5,732,333 A | * | 3/1998 | Cox et al. .................... 455/126 |
| 5,923,712 A | * | 7/1999 | Leyendecker et al. ....... 375/297 |
| 5,937,011 A | * | 8/1999 | Carney et al. ............... 375/297 |
| 5,949,283 A | * | 9/1999 | Proctor et al. ............... 330/149 |
| 5,959,499 A | * | 9/1999 | Khan et al. .................. 330/149 |
| 6,125,266 A | * | 9/2000 | Matero et al. ............... 455/126 |

FOREIGN PATENT DOCUMENTS

| EP | 0096820 | 12/1983 | ............ H03C/1/06 |
| EP | 0731556 | 9/1996 | ............ H03F/1/32 |
| GB | 2316560 | 2/1998 | ............ H03F/1/34 |

* cited by examiner

Primary Examiner—Stephen Chin
Assistant Examiner—Chieh M. Fan
(74) Attorney, Agent, or Firm—Philip R. Wadsworth; Kent D. Baker; Thomas R. Rouse

(57) ABSTRACT

A predistortion technique for high power amplifiers includes an adaptive predistortion algorithm that operates independently of data samples to write a set of complex gain values, or predistortion parameters, to a lookup table. The algorithm may be processor-driven. The gain values are taken from the lookup table and multiplied by a complex digital baseband waveform. The gain values may first be subjected to interpolation. The downconverted output of the amplifier is measured to gauge the efficacy of the predistortion. Based on the effect of the predistortion upon the ratio of in-band power to out-of-band power, decisions are made on the set of predistortion parameters for the next iteration of the algorithm. The algorithm runs continuously, perturbing parameters and adapting the predistortion functions accordingly in an effort to continually reflect instantaneous amplitude-modulation and phase-modulation relationships that may change over time with temperature variation or component aging.

28 Claims, 4 Drawing Sheets

PREDISTORTION TECHNIQUE FOR HIGH POWER AMPLIFIERS

BACKGROUND OF THE INVENTION

I. Field of the Invention

The present invention pertains generally to the field of wireless communications, and more specifically to predistortion techniques for high power amplifiers.

II. Background

The field of wireless communications has many applications including, e.g., cordless telephones, paging, wireless local loops, and satellite communication systems. A particularly important application is cellular telephone systems for mobile subscribers. (As used herein, the term "cellular" systems encompasses both cellular and PCS frequencies.) Various over-the-air interfaces have been developed for such cellular telephone systems including, e.g., frequency division multiple access (FDMA), time division multiple access (TDMA), and code division multiple access (CDMA). In connection therewith, various domestic and international standards have been established including, e.g., Advanced Mobile Phone Service (AMPS), Global System for Mobile (GSM), and Interim Standard 95 (IS-95). In particular, IS-95 and its derivatives, IS-95A, IS-95B, ANSI J-STD-008, etc. (often referred to collectively herein as IS-95), are promulgated by the Telecommunication Industry Association (TIA) and other well known standards bodies.

Cellular telephone systems configured in accordance with the use of the IS-95 standard employ CDMA signal processing techniques to provide highly efficient and robust cellular telephone service. An exemplary cellular telephone system configured substantially in accordance with the use of the IS-95 standard is described in U.S. Pat. No. 5,103,459, which is assigned to the assignee of the present invention and fully incorporated herein by reference. The aforesaid patent illustrates transmit, or forward-ink, signal processing in a CDMA base station. Exemplary receive, or reverse-link, signal processing in a CDMA base station is described in U.S. application Ser. No. 08/987,172, filed Dec. 9, 1997, entitled MULTICHANNEL DEMODULATOR, which is assigned to the assignee of the present invention and fully incorporated herein by reference.

In CDMA systems, over-the-air power control is a vital issue. An exemplary method of power control in a CDMA system is described in U.S. Pat. No. 5,056,109, which is assigned to the assignee of the present invention and fully incorporated herein by reference.

A primary benefit of using a CDMA over-the-air interface is that communications are conducted over the same RF band. For example, each mobile subscriber unit (typically a cellular telephone) in a given cellular telephone system can communicate with the same base station by transmitting a reverse-link signal over the same 1.25 MHz of RF spectrum. Similarly, each base station in such a system can communicate with mobile units by transmitting a forward-link signal over another 1.25 MHz of RF spectrum. It is to be understood that while 1.25 MHz is a preferred CDMA channel bandwidth, the CDMA channel bandwidth need not be restricted to 1.25 MHz, and could instead be any number, such as, e.g., 5 MHz.

Transmitting signals over the same RF spectrum provides various benefits including, e.g., an increase in the frequency reuse of a cellular telephone system and the ability to conduct soft handoff between two or more base stations. Increased frequency reuse allows a greater number of calls to be conducted over a given amount of spectrum. Soft handoff is a robust method of transitioning a mobile unit from the coverage area of two or more base stations that involves simultaneously interfacing with two base stations. (In contrast, hard handoff involves terminating the interface with a first base station before establishing the interface with a second base station.) An exemplary method of performing soft handoff is described in U.S. Pat. No. 5,267,261, which is assigned to the assignee of the present invention and fully incorporated herein by reference.

In conventional cellular telephone systems, a public switched telephone network (PSTN) (typically a telephone company) and a mobile switching center (MSC) communicate with one or more base station controllers (BSCs) over standardized E1 and/or T1 telephone lines (hereinafter referred to as E1/T1 lines). The BSCs communicate with base station transceiver subsystems (BTSs) (also referred to as either base stations or cell sites), and with each other, over a backhaul comprising E1/T1 lines. The BTSs communicate with mobile units (i.e., cellular telephones) via RF signals sent over the air.

As described in U.S. Pat. No. 5,103,459, a forward-link CDMA communication signal is modulated at a BTS with Walsh code covering and I and Q spreading. The resultant digital complex baseband CDMA waveform is then converted to an analog signal, upconverted to a carrier frequency signal, amplified with a high power amplifier (HPA), and sent to an antenna for RF transmission to a mobile unit. Due to the nonlinearity inherent in the HPA, the HPA stage is typically characterized by out-of-band (also known as sideband) emissions at the output of the HPA. The CDMA waveform for each frequency assignment at the output of the antenna must meet various out-of-band emission requirements pursuant to specifications set by the FCC and other regulatory bodies. It is necessary, therefore, that out-of-band emissions be attenuated.

In conventional systems, the out-of-band emissions were attenuated as required using analog filters following the HPA. However, this required extremely precise tuning of the filter to achieve the necessary accuracy. For enhanced accuracy, it would be desirable to provide a method of digitally attenuating out-of-band emissions. To decrease the number of transistors required in the HPA architecture and allow for the production of more efficient HPAs, predistortion may be applied at the input of the HPA. From a design standpoint, it is highly desirable that the HPA be able to work over a large range of input powers. However, a problem in designing a working HPA over such a large range of input powers is that the HPA will have a nonlinear gain and phase response at different input powers. Such nonlinearities result in undesired out-of-band emissions at the output of the HPA. Adjustments to the bias currents that increase the efficiency of the HPA further increase such nonlinear effects. Moreover, it would further be advantageous to provide a predistortion method that accounts for changes over time due to temperature variations and component aging. Thus, there is a need for a digital, adaptive predistortion technique that minimizes out-of-band emissions introduced by an HPA.

SUMMARY OF THE INVENTION

The present invention is directed to a digital, adaptive predistortion technique that minimizes out-of-band emissions introduced by an HPA. Accordingly, in one aspect of the invention, a method of reducing out-of-band emissions from an amplifier advantageously includes the steps of multiplying a digital input signal to the amplifier with a set of digital predistortion parameters, measuring the output power level of the out-of-band emissions from the amplifier, and adjusting the set of parameters based upon the measured output power level of the out-of-band emissions from the amplifier. In another aspect of the invention, a device for reducing out-of-band emissions from an amplifier advantageously includes complex multiplication logic for multiplying digital predistortion parameters with a digital input signal, an amplifier coupled to the complex multiplication logic, and a processor logically coupled to the amplifier for digitizing an output signal from the amplifier, processing the digitized output signal, and modifying the digital predistortion parameters based upon the output signal.

DETAILED DESCRIPTION OF THE PREFERRED EMBODIMENTS

Various cellular systems for wireless telephone communication employ fixed base stations that communicate with mobile units via an over-the-air interface. Such cellular systems include, e.g., AMPS (analog), IS-54 (North American TDMA), GSM (Global System for Mobile communications TDMA), and IS-95 (CDMA). In a preferred embodiment, the cellular system is a CDMA system.

Figure 1:
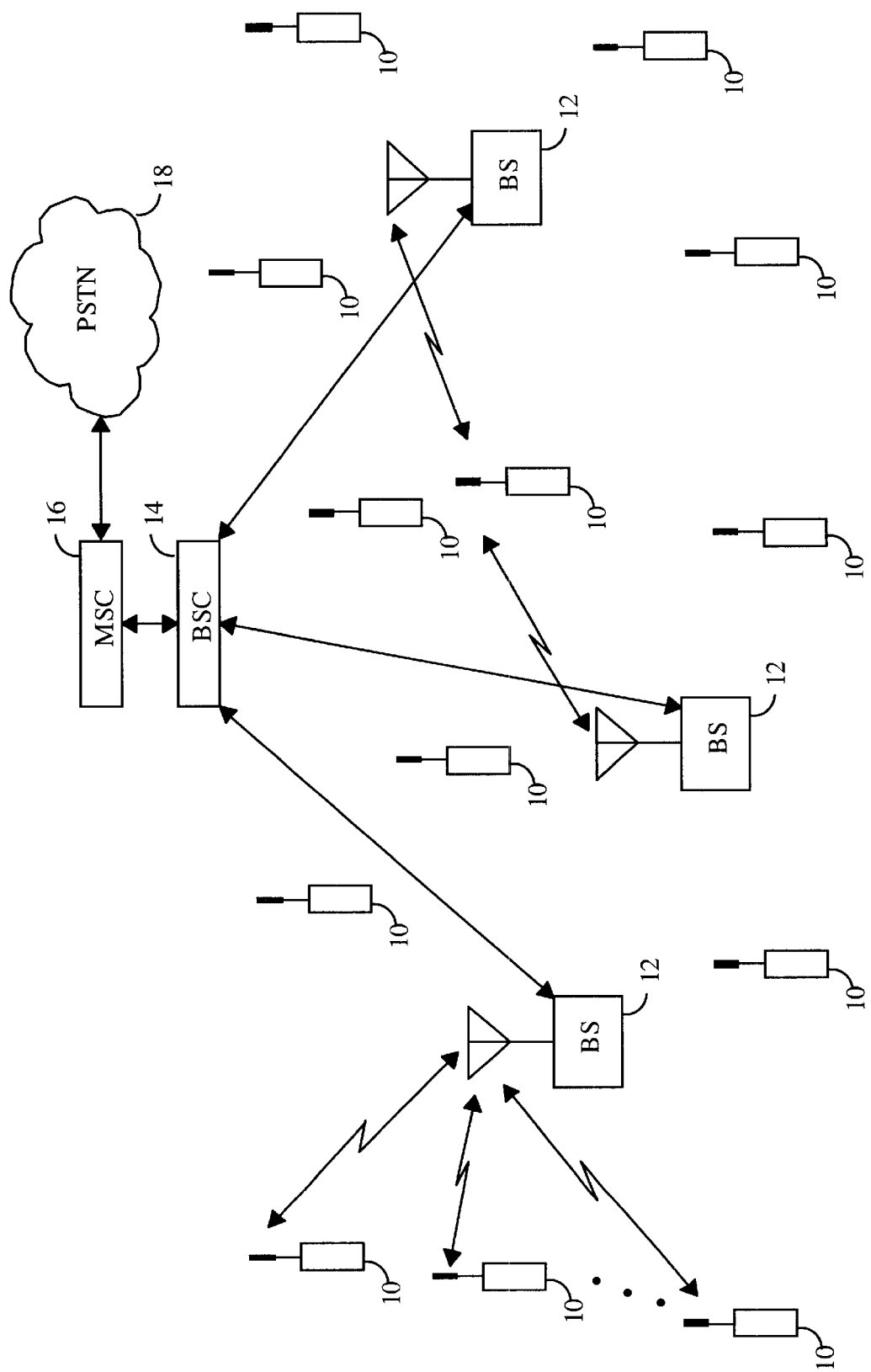
FIG. 1 is a block diagram of a cellular telephone system.

As illustrated in FIG. 1, a CDMA wireless telephone system generally includes a plurality of mobile subscriber units 10, a plurality of base stations 12, a base station controller (BSC) 14, and a mobile switching center (MSC) 16. The MSC 16 is configured to interface with a conventional public switched telephone network (PSTN) 18. The MSC 16 is also configured to interface with the BSC 14. The BSC 14 is coupled to each base station 12 via backhaul lines. In various embodiments the backhaul lines may be configured for voice and/or data transmission in accordance with any of several known interfaces including, e.g., standardized E1 and/or T1 telephone lines (E1/T1), Asynchronous Transfer Mode (ATM), or Internet Protocol (IP). It is to be understood that there can be more than one BSC 14 in the system. Each base station 12 advantageously includes at least one sector (not shown), each sector comprising an omnidirectional antenna or an antenna pointed in a particular direction radially away from the base station 12. Alternatively, each sector may comprise two antennas for diversity reception. Each base station 12 may advantageously be designed to support a plurality of frequency assignments, with each frequency assignment advantageously comprising 1.25 MHz of spectrum. Alternatively, each frequency assignment may comprise an amount of spectrum other than 1.25 MHz, such as, e.g., 5 MHz. The intersection of a sector and a frequency assignment may be referred to as a CDMA channel. The base stations 12 may also be known as base station transceiver subsystems (BTSs) 12. Alternatively, "base station" may be used in the industry to refer collectively to a BSC 14 and one or more BTSs 12.

The BTSs 12 may also be denoted "cell sites" 12. (Alternatively, individual sectors of a given BTS 12 may be referred to as cell sites.) The mobile subscriber units 10 are typically cellular telephones 10, and the cellular telephone system is advantageously a CDMA system configured for use in accordance with the IS-95 standard.

During typical operation of the cellular telephone system, the base stations 12 receive sets of reverse-link signals from sets of mobile units 10. The mobile units 10 are conducting telephone calls or other communications. Each reverse-link signal received by a given base station 12 is processed within that base station 12. The resulting data is forwarded to the BSC 14. The BSC 14 provides call resource allocation and mobility management functionality including the orchestration of soft handoffs between base stations 12. The BSC 14 also routes the received data to the MSC 16, which provides additional routing services for interface with the PSTN 18. Similarly, the PSTN 18 interfaces with the MSC 16, and the MSC 16 interfaces with the BSC 14, which in turn controls the base stations 12 to transmit sets of forward-link signals to sets of mobile units 10.

Figure 2:
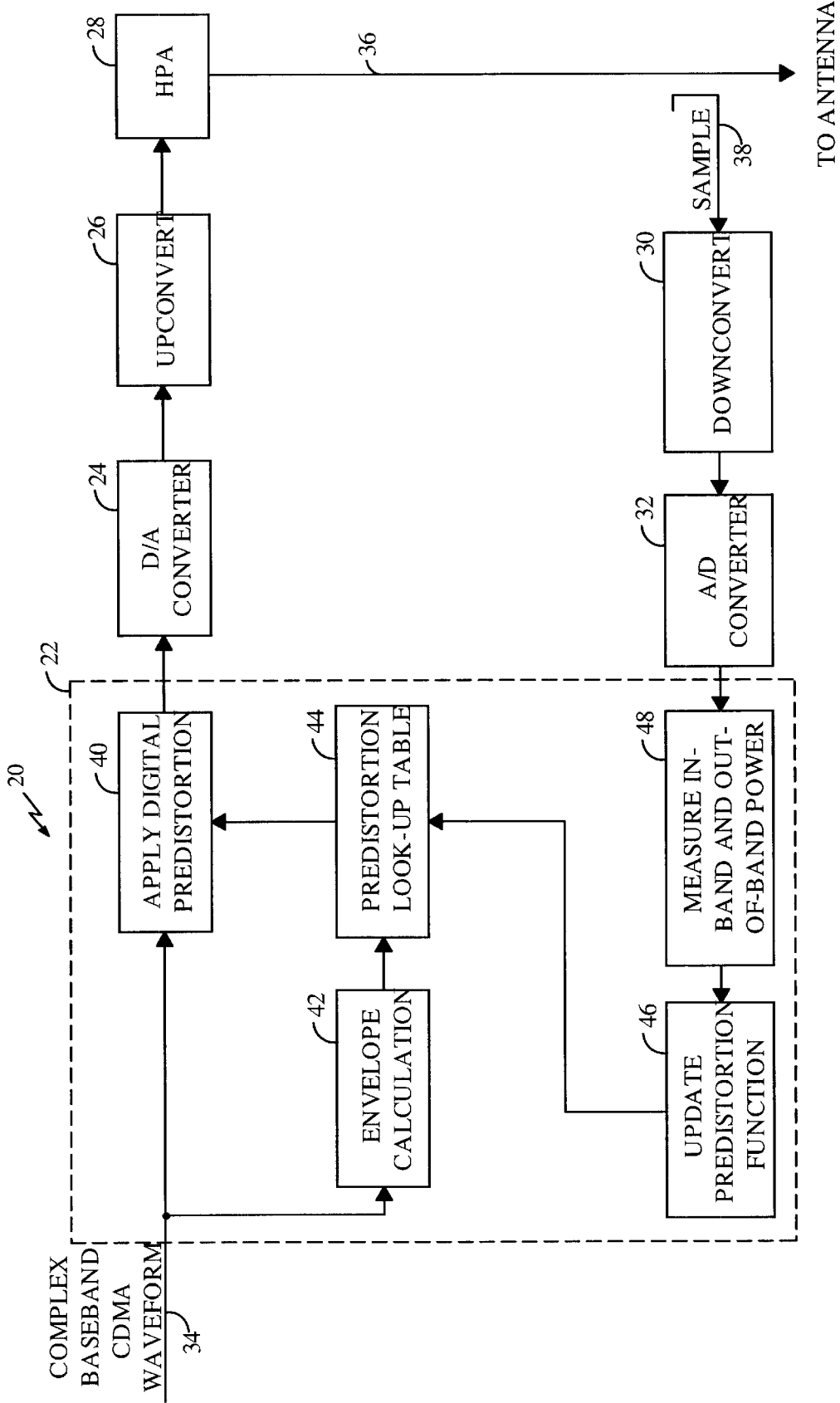
FIG. 2 is a block diagram of a circuit for converting a CDMA digital complex baseband waveform into a waveform suitable for RF transmission.

In one embodiment, shown in FIG. 2, a complex baseband COMA forward channel waveform is converted to a signal suitable for RF transmission with the aid of digital predistortion circuitry to reduce out-of-band emissions following the HPA stage. In other embodiments, multiple adjacent COMA forward channel waveforms can be prepared for RE transmission with the aid of digital predistortion circuitry. In FIG. 2, a baseband-to-RE-conversion circuit 20 includes a predistortion block 22, a D/A converter 24, an upconverter 26, an HPA 28, a downconverter 30, and an A/D converter 32. The predistortion block 22 is coupled to an input complex baseband COMA waveform 34. The predistortion block 22 is also coupled to the D/A converter 24. The D/A converter 24 is coupled to the upconverter 26, which in turn is coupled to the HPA 28. The HPA 28 is configured to send an output RE signal 36 to an antenna (not shown). Samples 38 taken periodically from the RE signal 36 are coupled to the downconverter 30. The downconverter 30 is coupled to the ND converter 32, which in turn is coupled to the predistortion block 22.

The predistortion block 22 includes an application block 40 for applying digital predistortion, an envelope calculation block 42, a predistortion lookup table, or LUT, 44, an update predistortion function 46, and a power measurement block 48 for measuring in-band power and out-of-band power. The application block 40 is coupled to the input baseband signal 34 and to the D/A converter 24. The input baseband signal 34 is also coupled to the envelope calculation block 42. The envelope calculation block 42 is coupled to the predistortion lookup table 44, which in turn is coupled to the application block 40. The power measurement block 48 is coupled to the A/D converter 32 and to the update predistortion function 46. The update predistortion function 46 is coupled to the predistortion lookup table 44.

The conversion circuit 20 may advantageously be implemented as part of a modulation ASIC in a BTS. Implementation of the D/A, A/D, upconversion, and downconversion functions on an ASIC, or on a DSP chip, is known in the art. Moreover, as those skilled in the art would understand, the conversion circuit 20 may instead be implemented with discrete hardware components available off-the-shelf. Alternatively, depending on design constraints, the HPA 28 may be a discrete amplifier while the remainder of the conversion circuit 20 is implemented as an ASIC.

In the conversion circuit 20, the nonlinearity in the HPA 28 is modeled as an amplitude-and-phase distortion that is a function of the instantaneous input-signal envelope. During operation, the complex digital baseband CDMA waveform 34 is predistorted with an approximation to the inverse nonlinearity in the HPA 28. In this way, the nonlinearities caused by the predistortion and the nonlinearities resulting from the EPA 28 cancel to some degree, yielding in reduced out-of-band emissions. Ideally, the nonlinearities would cancel exactly. However, this is difficult to achieve in practice because the nonlinearity of the HPA 28 can change over time. Thus, the predistortion function is continuously adapted to track changes in the nonlinearity of the HPA 28 over time.

The predistortion function applied at digital baseband is a function of the instantaneous signal envelope. In the envelope calculation block 42, the envelope of the CDMA waveform 34 at complex digital baseband is obtained by calculating $I^2+Q^2$, where I and Q are, respectively, the in-phase and quadrature-phase components of the digital CDMA waveform 34. The predistortion function is stored in the lookup table 44, which stores gain and phase values as a function of signal envelope. For envelope values that fall between entries in the lookup table 44, the gain and phase predistortion values are calculated by interpolation between adjacent entries in the lookup table 44. The predistortion function is modified over time by changing the gain and phase parameters in the lookup table. In one embodiment this modification is performed with software instructions executed by a processor, as described in detail below.

The digital predistorted signal is converted to an analog signal with the D/A (digital-to-analog) converter 24. The analog signal is then up-converted to the carrier frequency by the upconverter 26 and amplified by the HPA 28. The degree to which the predistortion function accurately models the inverse of the nonlinearity in the HPA 28 determines the amount of out-of-band power at the output of the HPA 28. When the predistortion function is the exact inverse of the nonlinearity, the out-of-band power is minimized. Hence, the feedback from the A/D converter 32 to the digital adaptive amplifier predistortion algorithm 22 is based upon the amount of power in-band and out-of-band.

The in-band and out-of-band power are measured by additional circuitry (not shown) in the power measurement block 48. The output of the HPA 28 is sampled, and the samples 38 are downconverted with the downconverter 30. The downconverted analog signal is converted to a digital signal with the A/D (analog-to-digital) converter 32. The in-band and out-of-band power are advantageously calculated digitally using digital signal processing methods known in the art. In one embodiment Fast Fourier Transforms (FFTs) are used for the power calculations. In another embodiment a filter (not shown) may be substituted for the FFT averaging.

Based on the amount of measured power in-band relative to the amount of measured power out-of-band (i.e., the ratio of in-band power to out-of-band power (RIO)), the adaptive amplifier predistortion algorithm 22 modifies the predistortion lookup table 44 accordingly. A relatively small change is made to the predistortion function, the resulting in-band power and out-of-band power are measured, and the small change is either kept or discarded depending on whether the overall performance improved or degraded.

In one embodiment the adaptive predistortion algorithm 22 uses a relatively small number of parameters. The algorithm 22 cycles through the parameters, making small changes to one parameter at a time and either keeps or rejects the change depending upon the resulting change in predistortion performance. The predistortion function may be defined by two curves representing the predistortion gain and predistortion phase values as a function of input-signal envelope. The adaptive predistortion algorithm 22 parameters comprise gain and phase values at specific values of the envelope prior to predistortion. Interpolating between the gain and phase parameter values over the entire range of possible signal envelopes generates the predistortion gain and phase curves.

Figure 3:
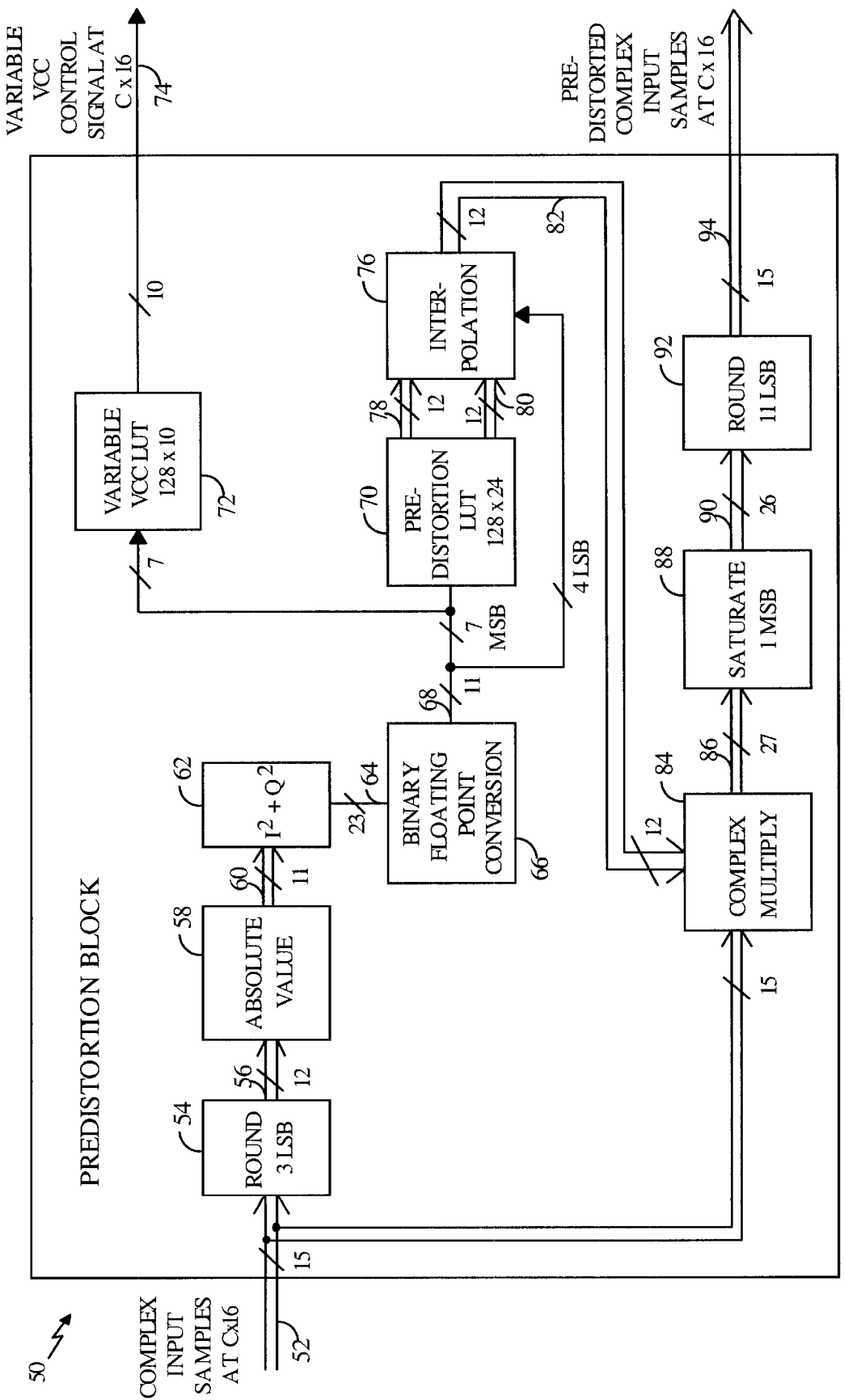
FIG. 3 is a block diagram of an adaptive predistortion circuit that can be used in the circuit of FIG. 2.

In one embodiment, illustrated in FIG. 3, an adaptive predistortion circuit 50 includes various mathematical and functional logic blocks and lookup tables, as shown. Thus, in the adaptive predistortion circuit 50, fifteen-bit complex input samples (i.e., both I and Q samples) 52 are sent to a rounding block 54 that rounds the three least-significant bits to reduce calculation complexity. In a particular embodiment, the samples 52 are taken at sixteen times the chip rate specified in IS-95 (i.e., 16×1.2288 MHz). The rounding block 54 then sends twelve-bit complex samples 56 to absolute value calculation logic 58, which derives the absolute value and sends resultant eleven-bit complex samples 60 to $I^2+Q^2$ calculation logic 62. The $I^2+Q^2$ logic 62 squares and sums the complex samples 60 and sends a twenty-three-bit signal 64 to binary floating point conversion logic 66. The binary floating point conversion logic 66 outputs an eleven-bit-signal 68. The most-significant seven bits of the eleven-bit signal 68, which represent a lookup table index, are coupled to a predistortion lookup table 70 and also to a variable Vcc lookup table 72. The variable Vcc lookup table 72 advantageously has dimensions 128×10 and outputs a ten-bit variable Vcc control signal 74 at sixteen times the IS-95 chip rate. The four least-significant bits of the eleven-bit signal 68, which represent an interpolation factor, are coupled to interpolation logic 76. The predistortion lookup table 70 is coupled to the interpolation logic 76 via first and second twelve-bit complex connections 78, 80. The interpolation logic 76 ouputs a twelve-bit complex signal 82 to complex multiplication logic 84. The complex multiplication logic 84 is coupled to the complex input samples 52. The complex multiplication logic 84 multiplies the fifteen-bit complex input samples 52 and the twelve-bit complex signal 82. The complex multiplication logic 84 sends a resultant twenty-seven-bit complex signal 86 to saturation logic 88, which saturates the most-significant bit of the twenty-seven-bit complex signal 84. The saturation logic 88 sends a resultant twenty-six-bit complex signal 90 to rounding logic 92, which rounds the eleven least-significant bits of the twenty-six-bit complex signal 90. The rounding logic 92 outputs resultant fifteen-bit predistorted complex input samples 94 at sixteen times the IS-95 chip rate.

The adaptive predistortion circuit 50 may advantageously be implemented as part of a modulation ASIC in a BTS. Implementation of mathematical functions such as rounding, saturation, addition, multiplication, binary floating point conversion, and absolute-value calculation on an ASIC is well known in the art. The lookup tables 70, 72 may advantageously be implemented on the ASIC, with addressable registers, or with RAM memory. Alternatively, as those skilled in the art would understand, the adaptive predistortion circuit 50 may be implemented with discrete hardware components available off-the-shelf.

In one embodiment the predistortion lookup table 70 is advantageously software downloadable. As described in greater detail below with respect to FIG. 4, a set of software instructions executed by a processor (not shown) serves to write values to the predistortion lookup table 70. The processor is advantageously a Pentium® microprocessor manufactured by Intel Corporation and available off-the-shelf. Alternatively, the processor could be a controller, a microcontroller, a state machine, firmware instructions, or any other equivalent device known to those of skill in the art.

In the embodiment of FIG. 3, the adaptive predistortion algorithm 50 minimizes the out-of-band emissions at the output of an HPA. The out-of-band emissions are caused by nonlinearities between the output of the ASIC (not shown) and the output of the HPA. The predistortion is applied digitally at complex baseband in the ASIC.

Most of the nonlinearities are introduced in the HPA and can be characterized by amplitude and phase modulation as a function of the instantaneous input-signal envelope. These relationships are also known as AM—AM and AM-PM distortion, respectively. The nonlinearities in the HPA are assumed to be "memoryless" and solely a function of the instantaneous input-signal envelope. Therefore, the AM—AM and AM-PM relationships completely characterize the HPA nonlinearity.

The predistortion algorithm 50 minimizes the out-of-band emissions at the output of the HPA by applying an inverse AM—AM-and-AM-PM distortion at digital baseband. If the applied predistortion function is exactly the inverse nonlinearity, the nonlinearities cancel and the combined system is linear, up to the point of amplifier saturation.

Thus, the HPA predistortion algorithm 50 advantageously characterizes the nonlinear AM—AM and AM-PM distortion in the HPA, and then applies the inverse nonlinear distortion. Since the HPA AM—AM and AM-PM distortions vary over respective HPAs, temperature, and aging, an adaptive predistortion algorithm 50 is necessary.

It is convenient to apply the predistortion function at complex digital baseband because the signal envelope can be accurately calculated by $\sqrt{I^2+Q^2}$, and an arbitrary nonlinearity can be applied by complex multiplication with a value taken from the predistortion lookup table 70. The complex multiplication operation 84 advantageously allows for both amplitude and phase predistortion.

As those skilled in the art would understand, the index to the predistortion lookup table 70 is, conceptually, the signal envelope. Nevertheless, the lookup table index can be generated by any function of the signal envelope that satisfies the following requirements: (1) the index must be phase-independent; (2) the index must be monotonic with the signal envelope; (3) the index must span at least 40 dB dynamic range; and (4) the index must sufficiently sample the predistortion function. In one embodiment the predistortion function is advantageously defined by a software downloadable lookup table 70.

In the adaptive predistortion circuit 50, the predistortion is advantageously implemented at the lowest sample rate possible in order to minimize hardware complexity. The sample rate selection is based on the required bandwidth of the predistorted CDMA waveform. In one embodiment the sample rate used to represent the predistorted waveform without aliasing is sixteen times the IS-95 chip rate, with the CDMA waveform being centered at baseband.

The lookup table index is generated from the complex baseband input samples 52. The lookup table index may advantageously be generated by a phase-independent transformation from complex samples to real samples followed by a nonlinear compression to increase the dynamic range with fewer bits. The complex values 52 at the input to the predistortion circuit 50 are represented with fifteen bits for both I and Q. As up to three least-significant bits may be rounded without significantly degrading adaptive predistortion performance, the rounding logic 54 rounds three least-significant bits from the samples 52 because rounding three bits reduces the complexity.

Advantageously, the absolute-value calculation logic 58 may take the absolute value of the truncated samples 56 because only the envelope magnitude is important for predistortion purposes. The phase-independent transformation is accomplished by calculating the energy ($I^2+Q^2$) with the $I^2+Q^2$ calculation logic 62. As I and Q are represented with eleven bits, the resultant sum is a twenty-three-bit number 64.

If the index to the predistortion lookup table 70 were the most-significant bits of the energy value ($I^2+Q^2$), a fourteen-bit lookup table index would be required to span a 40 dB dynamic range. To reduce the number of bits necessary to span the dynamic range, the energy is advantageously compressed via the binary floating point conversion logic 66 with a nonlinear function that re-represents the energy in binary floating point. An exemplary binary floating point conversion is shown in Table 1 below. In one embodiment the floating point conversion is implemented in hardware, using a four-bit exponent to span a 48 dB dynamic range. In addition to the four-bit exponent, some bits of the mantissa are required to form the index of the predistortion lookup table 70 to reduce the step size between adjacent entries.

TABLE 1

Lookup Table Index and Interpolation Factor Definition

| 23-bit energy | 11-bit energy in floating point | 7-bit LUT index (N) | 4-bit interpolation factor (K) |
| --- | --- | --- | --- |
| $1b_6b_5b_4b_3b_2b_1b_0$xxxxxxxxxxxxxxxx | $1111b_6b_5b_4b_3b_2b_1b_0$ | $1111b_6b_5b_4$ | $b_3b_2b_1b_0$ |
| $01b_6b_5b_4b_3b_2b_1b_0$xxxxxxxxxxxxxxx | $1110b_6b_5b_4b_3b_2b_1b_0$ | $1110b_6b_5b_4$ | $b_3b_2b_1b_0$ |
| $001b_6b_5b_4b_3b_2b_1b_0$xxxxxxxxxxxxxx | $1101b_6b_5b_4b_3b_2b_1b_0$ | $1101b_6b_5b_4$ | $b_3b_2b_1b_0$ |
| $0001b_6b_5b_4b_3b_2b_1b_0$xxxxxxxxxxxxx | $1100b_6b_5b_4b_3b_2b_1b_0$ | $1100b_6b_5b_4$ | $b_3b_2b_1b_0$ |
| $00001b_6b_5b_4b_3b_2b_1b_0$xxxxxxxxxxxx | $1011b_6b_5b_4b_3b_2b_1b_0$ | $1011b_6b_5b_4$ | $b_3b_2b_1b_0$ |
| $000001b_6b_5b_4b_3b_2b_1b_0$xxxxxxxxxxx | $1010b_6b_5b_4b_3b_2b_1b_0$ | $1010b_6b_5b_4$ | $b_3b_2b_1b_0$ |
| $0000001b_6b_5b_4b_3b_2b_1b_0$xxxxxxxxxx | $1001b_6b_5b_4b_3b_2b_1b_0$ | $1001b_6b_5b_4$ | $b_3b_2b_1b_0$ |
| $00000001b_6b_5b_4b_3b_2b_1b_0$xxxxxxxxx | $1000b_6b_5b_4b_3b_2b_1b_0$ | $1000b_6b_5b_4$ | $b_3b_2b_1b_0$ |
| $000000001b_6b_5b_4b_3b_2b_1b_0$xxxxxxxx | $0111b_6b_5b_4b_3b_2b_1b_0$ | $0111b_6b_5b_4$ | $b_3b_2b_1b_0$ |
| $0000000001b_6b_5b_4b_3b_2b_1b_0$xxxxxxx | $0110b_6b_5b_4b_3b_2b_1b_0$ | $0110b_6b_5b_4$ | $b_3b_2b_1b_0$ |
| $0000000000b_6b_5b_4b_3b_2b_1b_0$xxxxxx | $0101b_6b_5b_4b_3b_2b_1b_0$ | $0101b_6b_5b_4$ | $b_3b_2b_1b_0$ |
| $00000000001b_6b_5b_4b_3b_2b_1b_0$xxxx | $0100b_6b_5b_4b_3b_2b_1b_0$ | $0100b_6b_5b_4$ | $b_3b_2b_1b_0$ |
| $000000000001b_6b_5b_4b_3b_2b_1b_0$xxx | $0011b_6b_5b_4b_3b_2b_1b_0$ | $0011b_6b_5b_4$ | $b_3b_2b_1b_0$ |
| $00000000000001b_6b_5b_4b_3b_2b_1b_0$xx | $0010b_6b_5b_4b_3b_2b_1b_0$ | $0010b_6b_5b_4$ | $b_3b_2b_1b_0$ |

TABLE 1-continued

Lookup Table Index and Interpolation Factor Definition

| 23-bit energy | 11-bit energy in floating point | 7-bit LUT index (N) | 4-bit interpolation factor (K) |
|---|---|---|---|
| 000000000000001$b_6b_5b_4b_3b_2b_1b_0$x | 0001$b_6b_5b_4b_3b_2b_1b_0$ | 0001$b_6b_5b_4$ | $b_3b_2b_1b_0$ |
| 000000000000000$b_6b_5b_4b_3b_2b_1b_0$x | 0000$b_6b_5b_4b_3b_2b_1b_0$ | 0000$b_6b_5b_4$ | $b_3b_2b_1b_0$ |

A seven-bit lookup table index advantageously yields negligible performance degradation. Therefore, the seven most-significant bits of the energy represented in binary floating point 68 are used as the lookup table index. Consequently, the predistortion lookup table 70 is a 128-entry lookup table 70. To decrease the step size between entries in the predistortion lookup table 70, linear interpolation may advantageously be used to increase the resolution. As there is negligible performance degradation when four bits are used for linear interpolation between lookup table entries, the four least-significant bits following the seven most-significant bits used for the lookup table index are used for lookup table interpolation. Four bits for linear interpolation yields sixteen possible interpolation offsets.

The four-bit interpolation factor is used by the interpolation logic 76 to linearly interpolate between consecutive entries in the predistortion lookup table 70. Letting the seven-bit lookup table index be N and the four-bit interpolation offset be K, where N ranges from 0 to 127 and K ranges from 0 to 15, allows the real and imaginary interpolated values to be calculated by the following equations:

$$Val(N,K)=[(16-K)/16]\times LUT(N)+(K/16)\times LUT(N+1) \text{ for } N<2^7-1;$$

$$Val(N,K)=LUT(N) \text{ otherwise}$$

Letting the complex predistortion values from the predistortion lookup table 70 be represented by LUT(N) and LUT(N+1), the linear interpolation may advantageously be performed by calculating the quantity G1×LUT(N)+G2×LUT(N+1). The values of G1 and G2 depend on the interpolation offset and are listed directly below in Table 2.

TABLE 2

Linear Interpolation Gains

| Interpolation offset | G1 | G2 |
|---|---|---|
| 0 | 16 | 0 |
| 1 | 15 | 1 |
| 2 | 14 | 2 |
| 3 | 13 | 3 |
| 4 | 12 | 4 |
| 5 | 11 | 5 |
| 6 | 10 | 6 |
| 7 | 9 | 7 |
| 8 | 8 | 8 |
| 9 | 7 | 9 |
| 10 | 6 | 10 |
| 11 | 5 | 11 |
| 12 | 4 | 12 |
| 13 | 3 | 13 |
| 14 | 2 | 14 |
| 15 | 1 | 15 |

If LUT(N) and LUT(N+1) are K-bit values and G1 and G2 are four-bit values, then (K+4) bits are required to represent the multiplication result. The sum G1×LUT(N)+G2×LUT(N+1)) is a (K+5)-bit value. From the (K+5)-bit value, one least-significant bit is saturated, yielding a (K+4)-bit value, and four most-significant bits are rounded, producing the final K-bit interpolated complex value 82.

The complex multiplication logic 84 implements the amplitude and phase predistortion function. In one embodiment the predistortion algorithm 50 requires at least 6 dB of gain predistortion and at least 90 degrees of phase predistortion dynamic range. Constraining the real and imaginary parts of the complex predistortion values in the predistortion lookup table 70 to be positive advantageously allows a simplified implementation to meet the above requirements. Rounding one less bit than the number of bits needed to represent the complex numbers in the predistortion lookup table 70 advantageously yields a 6 dB gain at 0 degrees and 90 degrees, and a 9 dB gain at 45 degrees. But maintaining strictly positive values for both the real and imaginary parts of the complex numbers in the predistortion lookup table 70 limits the phase predistortion dynamic range to exactly 90 degrees. Thus, for all phase angles, the requirement of 6 dB of gain predistortion is satisfied.

The number of bits used to represent the complex numbers in the predistortion lookup table 70 determines the resolution of the predistortion function. Using twelve bits to represent the real and imaginary parts 78, 80 of the complex numbers produces negligible performance degradation.

In one embodiment the size of the predistortion lookup table 70 is 128 entries by twenty-four bits, or a total memory requirement of 3072 bits. As the predistortion lookup table 70 is programmable and is updated during operation, it is advantageously double buffered, increasing the memory requirement by a factor of two to 6144 bits.

The same lookup table index used for adaptive predistortion lookup table 70 may be used to index the variable Vcc lookup table 72, which tables the variable Vcc control voltage values. In one embodiment the variable Vcc control voltage signal is accurately represented with ten bits. In one embodiment the memory requirement for the variable Vcc lookup table 72 is 128 entries by ten bits, yielding a total of 1280 bits. If the variable Vcc lookup table 72 is double buffered, the memory requirement increases to 2560 bits.

Figure 4:
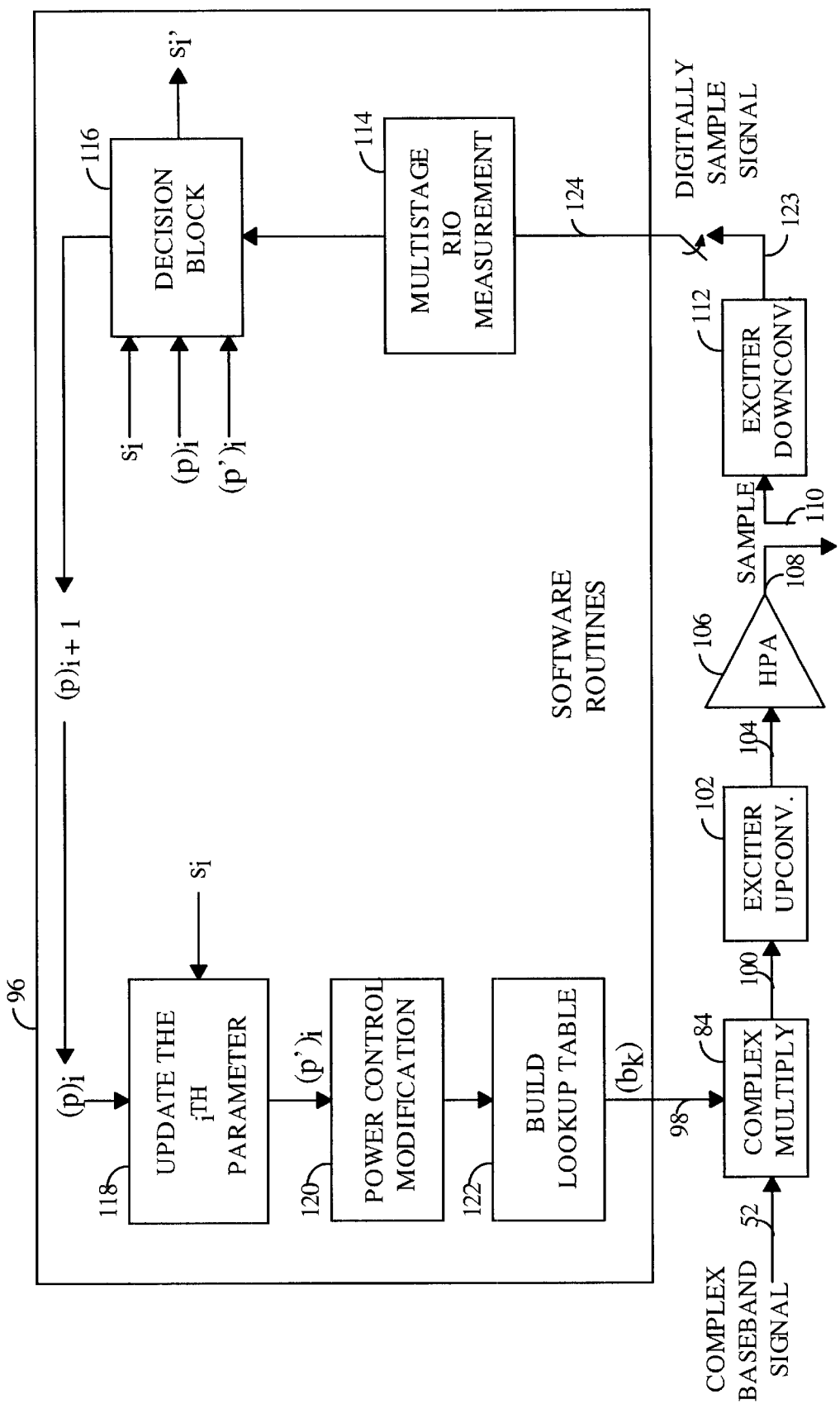
FIG. 4 is a block diagram illustrating the application of a software-implemented algorithm to the adaptive predistortion circuit of FIG. 3.

In one embodiment, shown in FIG. 4, a software routine (depicted functionally as 96) is used to generate complex coefficient parameters that are written to the predistortion lookup table (70 in FIG. 3), interpolated, and input as complex signals (82 in FIG. 3) to complex multiplication logic 84. The complex multiplication logic 84 receives and multiplies together a complex baseband signal 52 and predistortion parameters 98, generating a resultant signal 100. The complex multiplication logic 84 is coupled to an upconverter 102, which upconverts the signal 100 to a carrier frequency signal 104. The upconverter 102 is coupled to an HPA 106, which amplifies the signal 104, generating an output RF signal 108 for transmission by an antenna (not shown).

In the embodiment of FIG. 4, the calculations of the software routines 96 are performed in a processor, independently of actual data samples 110, which are downconverted by the downconverter 112 and then digitally sampled for use as modifiers, as described in detail below. The software routines 96 are used to write a set of complex values $b_k$ to the lookup table. These values (also herein denoted gains, parameters, or coefficients) $b_k$ are multiplied with the complex digital baseband waveform 52 in the complex multiplication logic 84. The output of the HPA 106 is sampled, downconverted by the downconverter 112, and measured to gauge the efficacy of the predistortion. The ratio of in-band to out-of-band power (RIO) is measured (depicted functionally as block 114). Based on the effect of the predistortion upon the RIO, decisions are made at decision block 116 on the set of predistortion parameters {p} for the next iteration of the algorithm. The routine 96 runs continuously, perturbing parameters and adapting the predistortion functions accordingly in an effort to continually reflect the instantaneous AM—AM and AM-PM relationships.

In connection with a functional block 118 for updating the $i^{th}$ parameter, the predistortion parameters are advantageously stored in software in a set of 2N+2 real parameters, 2N of which represent predistortion gain and phase as a function of the complex baseband signal magnitude. An additional two tilt parameters are advantageously added to adaptively equalize amplitude and phase variations that are a function of frequency. Each set of N parameters represents either the gain or phase at N input powers. The value of N is advantageously set to 8. The upper seven values are spaced evenly on a dB scale in power, spanning a 30 dB range. This configuration allows for predistortion points to cover a wide range of input powers, permitting the algorithm to function in the extremes of only a pilot signal being present at ten percent power, or with a fully loaded system at full power. An added predistortion point may advantageously be placed at 0 on a linear scale. This point is used to allow for predistortion gain and phase impact at extremely low input powers. In accordance with one embodiment, the parameter values for both one- and two-channel CDMA operation may be found in Table 3, below. A distinction is advantageously made between one- and two-channel CDMA operation to allow for maximum spanning of the appropriate ranges for each mode.

TABLE 3

Position of Predistortion Parameters in Linear Quanta

| Predistortion Parameter | Number of CDMA Channels | |
| --- | --- | --- |
| | 1 | 2 |
| 1 | 0 | 0 |
| 2 | 167 | 332 |
| 3 | 297 | 590 |
| 4 | 528 | 1050 |
| 5 | 939 | 1867 |
| 6 | 1670 | 3320 |
| 7 | 2969 | 5905 |
| 8 | 5280 | 10500 |

The predistortion algorithm cycles through the parameters, {p}, alternating between modifying gain and phase in successive iterations. The algorithm starts at the lowest power and increases the power level every even iteration. Once the set of 2N predistortion parameters has been cycled through, the two tilt parameters, $t_\alpha$ and $t_\beta$, are modified, after which the cycle wraps back to the lowest power level. In other words, if $g_k$ and $\phi_k$ are the predistortion gain and phase respectively, at the $k^{th}$ power level, then the iteration order is $$\ldots \to g_1 \to \phi_1 \to g_2 \to \phi_2 \to \ldots \to g_{N-1} \to \phi_{N-1} \to g_N \to \phi_N \to t_\alpha \to t_\beta \to g_1 \to \phi_1 \to \ldots$$

A vector of step-sizes, {s}, contains the magnitude and direction information for the modification steps. On the $j^{th}$ iteration, the step $s_i$ is added to the appropriate parameter, $p_i$, to generate a new set of parameters, {p'}. When the algorithm first commences, the parameters, $\{p\}|_{j=0}$, are initialized such that the predistortion value for all gains, $g_k$, is 0 dB, and that of phases, $$\phi_k, \text{ is } \frac{\pi}{4}$$

radians. Further, during the course of the predistortion algorithm, the gains, $g_k$, are limited to 6 dB, and the phase, $\phi_k$, to the range $$\left[0, \frac{\pi}{2}\right].$$

In the event that steps attempt to modify the parameters beyond these limits, the modified parameters are set to the value that is sought to be exceeded.

There is a finite probability that the empirical measurement of RIO, performed in connection with functional block 114, may be a low-probability estimate of the "exact" value. Thus, there is a need to verify the previous measurement. Therefore, at a reevaluation point, no parameters are modified for a single iteration and the RIO value is remeasured and replaces the previous best value, RIO*, regardless of whether there is a reduction in out-of-band emissions. In one embodiment reevaluation is performed after twenty-three iterations of not finding a reduction in out-of-band emissions, allowing a full cycle of the predistortion parameters between reevaluations.

In one embodiment a digital filter (not shown) is added to filter the signal in the ASIC just before the signal is output by the D/A (24 in FIG. 2). The filter, which is applied to an intermediate frequency waveform at thirty-two times the IS-95 chip rate, serves to counteract ripple, which limits the efficacy of predistortion, in the frequency region of interest. Ideally, the filter is the inverse of a sinc function introduced by the sample-and-hold property of the D/A. It is advantageous to modify the filter adaptively to account for variation across components and variation introduced by aging. In one embodiment a seven-tap FIR filter is used. The tap coefficients for the filter are shown in Table 4, below. Two of the filters taps, labeled $t_\alpha$, and $t_\beta$, are allowed to vary between −31 and 0, inclusive. By changing the value of these taps, the gain and phase of the filter is modified, with the goal being that the modifiable taps will converge to the inverse of the sinc function.

TABLE 4

Seven-Tap Tilt FIR Filter Tap Coefficients

| Tap Number | Tap Value |
| --- | --- |
| 1 | −1 |
| 2 | 3 |
| 3 | $-31 \leq t_\alpha \leq 0$ |
| 4 | 183 |
| 5 | $-31 \leq t_\beta \leq 0$ |
| 6 | 3 |
| 7 | −1 |

Because the amplifier is more linear at lower powers, a predistortion step that reduces the average power of the signal may result in lower out-of-band emissions even though such a step may not bring the predistortion curves closer to the optimal inverse of the amplifier. Further, as the signal to noise ratio (SNR) of the signal is desired to be maintained, such a reduction in power is undesirable because it will reduce the digital range that is employed. Therefore, in connection with a functional block 120 for power control modification, the predistortion curves are modified to ensure that the average power before predistortion is the same as the average power after predistortion, i.e., that the nominal gain of predistortion is 0 dB. A gain/attenuation factor is applied multiplicatively to the signal prior to predistortion. This factor is integrated into the predistortion curve that is written to the lookup table (70 in FIG. 3), as described above in connection with FIG. 3.

The predistortion algorithm does not operate directly upon the signal; instead, the algorithm writes to the lookup table. The complex multiplication is then performed in the ASIC. Because the algorithm never encounters the actual signal, it is necessary to approximate the characteristics of the signal in order to determine the nominal gain introduced by predistortion on the present signal. The average digital power of the signal is determined by using the channel gains, sector gain, rate set information, frame rate, and gating information. Both the I and the Q components of the CDMA waveform at the input to predistortion are assumed to be bandlimited Gaussian random variables. This assumption results in a Rayleigh distribution for the waveform envelope, $y=\sqrt{I^2+Q^2}$, $$f_y(y) = \frac{y}{\sigma^2} e^{-y^2/2\sigma^2}, \, y \geq 0$$

The Rayleigh distribution can be fully characterized by a single parameter, $\sigma$. As the moments of a Rayleigh distribution are $$E[y^k] = (2\sigma^2)^{k/2} \Gamma\left(1+\frac{k}{2}\right),$$

the parameter, $\sigma$, can be determined by $\sigma=\sqrt{E[y^2]/2}$. The average power for any waveform, however, is simply $$P_{ave} = \frac{1}{N}\sum_{i=1}^{N} y_i^2.$$

But $P_{ave}$ also equals $E(y^2)$. Therefore, $$\sigma = \sqrt{\frac{P_{ave}}{2}}.$$

The average power of a CDMA channel at the output of a chip-rate-times-sixteen filter can be calculated, to within a constant, from the traffic channel statistics and the sector gain:

$$P_{ave} = Kg_s^2 \left[ 4^2(c_{pilot}^2 + c_{paging}^2 + c_{sync}^2) + \right.$$
$$\sum_{i,non-gated\,TC} c_i^2 \left(\frac{22+(RS_i=2)}{24}g_{R,i}^2 + \frac{2-(RS_i=2)}{24}4^2\right) +$$
$$\sum_{i,gated\,TC} ((PCG-FO_i)\%15 < 8)(c_i^2)$$

$$\left. c_i^2\left(\frac{22+(RS_i=2)}{24}g_{R,i}^2 + \frac{2-(RS_i=2)}{24}4^2\right)\right].$$

The variables, $c_i$, $RS_i$, $g_{R,i}$, and $FO_i$, are the channel gain, rate set, rate gain, and frame offset of the $i^{th}$ channel, respectively. The comparisons in the above equation yield 1 if true or 0 if false. The rate gain of a channel, $g_{R,i}$, is determined by $$g_{R,i} = \begin{cases} 4, & \text{full rate} \\ 2\sqrt{2}, & \text{half rate} \\ 2, & \text{quarter rate} \\ \sqrt{2}, & \text{eighth rate.} \end{cases}$$

Additionally, PCG is the current power control group index (ranging from 0 to 15), $g_S$ is the sector gain (a constant scaling factor for the entire forward CDMA waveform, or waveforms), and K is a scaling constant that combines all of the filter gains in the ASIC from the chip generation to the chip-rate-times-sixteen baseband waveform. The rate gain of the second term of both summations over i (which, as shown above, is set to 4) may advantageously be multiplied by factor of $\sqrt{2}$ or $\sqrt{3}$ if the BTS is in soft handoff with another BTS.

Once the power is calculated, the complete probability distribution of the CDMA envelope as a function of input power is known. Further, as the predistortion parameters, {p}, fully define the predistortion curves for all input powers, the distribution after predistortion can be determined. From this distribution, the average power after predistortion can be calculated. Thus, $$P_{ave,pd} = \Sigma p_y(y)(10^{g(y)/20}*y)^2,$$

where $p_y(y)$ is a sampled version of $f_y(y)$, and $g(y)$ is the gain in dB for the input power y. The value $g(y)$ is the spine-interpolated function generated from the predistortion gain parameters. This sum comprises twenty components equally spaced from 0 to the maximum envelope value (which depends on the number of CDMA channels). From this power, a power correction factor, $R=10^{(P_{ave}-P_{ave,pd})/20}$, is applied. Because the predistortion curve is nonlinear, the correction factor R may not result in the power after predistortion equaling the input power. Therefore, the correction process may advantageously be repeated. In one embodiment the iterative process is continued until $P_{ave,pd}$ approaches to within ±0.1 dB of $P_{ave}$.

Due to the nonlinear nature of the predistortion gain, it is possible that the corrections may cause the power after predistortion to oscillate above and below the correction range without meeting the ±0.1 dB specification. Therefore, in one embodiment, the correction loop is broken if the power does not converge acceptably after eight iterations.

The complex predistortion function is applied to the signal in the ASIC in the form of a lookup table. The software algorithm 96 creates and writes the lookup table each iteration. In one embodiment a seven-bit lookup table is employed. Therefore, the complex gain must be determined for each of the $2^7$ lookup table entries. First, the gain and phase values are obtained by interpolating between the N-point gain and phase functions specified by the parameter set, {p'}, using a cubic spline function.

Once calculated, the gain and phase values at the lookup table energies, $x_k$, are combined to form the complex lookup table entries, $b(x_k)$:

$b(x_k) = \lfloor 2048 * 10^{g(x_k)/10} e^{j\theta(x_k)} + 0.5 \rfloor.$

As a complex linear gain is desired, and the predistortion gain is stored in dB, the predistortion gain must be converted to linear units by the operation $10^{g(x_k)/20}$. In one embodiment, an ASIC implementation of the complex multiplication (see FIG. 3), the eleven least-significant bits of the output of the multiplication are dropped. Therefore, for a predistortion gain, $g(x_k)$, of 0 dB not to change the magnitude of the signal, an additional gain of 2048 quanta must be applied. Finally, since the predistortion gain and phase values are floating-point numbers, the complex gain must be quantized in order to be written as the lookup table entries.

Once these entries are calculated and entered into the lookup table, the ASIC switches to use the new table. As there is a constant signal upon which the ASIC is continually applying predistortion, the lookup table is double-buffered. The complex gain, $b(x_k)$, is applied multiplicatively to the signal 52 via the complex multiplier 84. The now-predistorted signal 100 is then upconverted via the upconverter 102 to RF frequencies. At the RF frequency, the signal 104 is input to the non-linear HPA 106. After various RF manipulations through the upconverter 102, the downconverted output 123 of the HPA 106 is sampled digitally. The downconverted output 123 bears the effect of both the predistortion and the HPA 106, and is used to determined the efficacy of the parameter modifications.

To use a lookup table for a function, it is necessary to perform some type of interpolation scheme in order to determine the values of that function at various intermediate points. Various methods are known, including, e.g., "nearest-neighbor," "linear," "cubic," and "spline." The characteristics of each method affect the accuracy of the interpolation. In most methods little attention is paid to the first or higher-order derivatives, resulting in stiff, jagged fits to the function. However, the spline interpolation function seeks to maintain continuity through the second derivative. Splines are polynomial functions between the points of interpolation, with coefficients determined slightly nonlocally by virtue of attention to higher-order derivatives.

In one embodiment a cubic splice function is used for interpolation in the adaptive predistortion algorithm. An interpolation scheme that has a continuous second derivative is determined by $$y(x) = Ay_j + By_{j+1} + Cy''_j + Dy''_{j+1},$$

where $$A \equiv \frac{x_{j+1} - x}{x_{j+1} - x_j}$$

$$B \equiv 1 - A = \frac{x - x_j}{x_{j+1} - x_j}$$

$$C \equiv \frac{1}{6}(A^3 - A)(x_{j+1} - x_j)^2$$

$$D \equiv \frac{1}{6}(B^3 - B)(x_{j+1} - x_j)^2.$$

However, in many cases the second derivative is unknown. The following set of N-2 equations can be used to determine the N $2^{nd}$ derivatives $y''_j, 1 \leq j \leq N$:

$$\frac{x_j - x_{j-1}}{6} y''_{j-1} + \frac{x_{j+1} - x_{j-1}}{3} y''_j + \frac{x_{j+1} - x_j}{6} y''_{j+1} = \frac{y_{j+1} - y_j}{x_{j+1} - x_j} - \frac{y_j - y_{j-1}}{x_j - x_{j-1}}.$$

Because these N-2 equations do not uniquely determine the N variables, two additional constraints are necessary. This is usually accomplished by setting the boundary second derivatives, $y''_1$ and $y''_N$, to zero. This method yields the so-called natural cubic spline. A detailed description of spline interpolation may be found in William H. Press et al., *Numerical Recipes in C* (Cambridge University Press, 2d ed. 1992).

To maximize the dynamic range of the A/D (32 in FIG. 2), the signal must be near the maximum and minimum values of the A/D without clipping (with a 12-bit A/D, clipping occurs at the values 0 and 4095). In one embodiment this is accomplished by attempting to ensure that the maximum and minimum values of the captured signal fall within the ranges of 148 to 748 for the minimum signal value and 3347 to 3947 for the maximum signal value. The algorithm performs this check as follows: A power-control-group worth of data is captured, which, in one embodiment, constitutes the maximum amount of data that the algorithm will consider in an iteration. If the maximum or minimum of the first 1000 samples falls outside the outer bounds of the specified ranges, then the data is discarded, an additional 0.25 dB of attenuation is introduced, and the next power control group is captured. Similarly, if the maximum or minimum of the 1000 samples falls inside the inner bounds of the respective ranges, then the given power control group is discarded, 0.25 dB of attenuation is removed, and the next power control group is captured. Only a subset of the captured data is observed to limit computation and to ensure that any required attenuation can be added or removed and another power control group be captured as quickly as possible. This advantageously limits the effect that changes in the power of the signal may have on automatic gain control (AGC) algorithms.

In connection with the functional block 114 for multistage RIO measurement, the downconverted output 123 of the HPA 106 is sampled by the A/D (see FIG. 2) and the data 124 is stored in the RIO measurement block 114. In one embodiment a field-programmable gate array (FPGA) (not shown) is used to store the data 124 in the RIO measurement block 114. The processor (not shown) then performs FFTs upon the data 124. In one embodiment sixty-four-point FFTs are used. The data samples 124 are windowed with a sixty-four-point Blackman window, and there is also an overlap of fifty percent between successive FFTs. The spectrum of the downconverted signal 123 is observed and the RIO is measured. The definition of RIO used by the algorithm measures the in-band power of the CDMA waveform and subtracts the out-of-band power in both the higher and lower sidebands. The bandwidth of the out-of-band measurements is advantageously wide, summing the out-of-band energy from ±1.25 MHz out from the carrier to the limits of the range of the FFT. Emphasis is placed on the largest out-of-band emissions to enable the predistortion algorithm to lower the sideband levels over many frequencies. As the largest sidebands decrease in level, the focus shifts to other sidebands that are slightly lower. Accordingly, the algorithm seeks to bring down the out-of-band emissions to a uniformly low level.

In one embodiment the RIO measurement process 114 is a multistage measurement process 114. Initially, data that is a complete power control group (PCG) in length is captured and stored in the RIO FPGA. This is necessary because the computational requirement of the FFTs does not allow for real-time processing of the data. Additionally, this amount of data is sufficient for the maximum number of FFT averages that will be performed. All of the FFTs will have the advantage of operating on a contiguous set of data points that does not span a PCG boundary. Thus, there will be no changes in power due to rate changes or the addition or subtraction of telephone calls. Table 5, below, summarizes multiple stages of RIO measurement in accordance with one embodiment.

TABLE 5

Multiple Stages of RIO Measurement

| Name of Stage | # of FFT Averages | ΔRIO Threshold |
|---|---|---|
| Early-Bail | 128 | 3 dB |
| Normal | 256 | .75 dB |
| Verification | 509 | 0 dB |

The first stage is an "early-bail" stage in which 128 FFT averages are performed and a value of RIO is obtained. This RIO value is compared to the previous best value of RIO, or RIO*. If the difference, RIO-RIO*, exceeds the early-bail threshold, no further processing of the captured data is performed and the parameter that resulted in the measurement reverts to its previous value. Step-size adjustments are also made, as described in detail below. In one embodiment an early-bail threshold of 3 dB is used. If the difference is less than the early-bail threshold, additional FFTs are performed on the data.

In the next, or "normal," stage, 256 FFT averages are performed and RIO is measured. Advantageously, the first 128 FFT averages are identical to those performed in the early-bail stage. Therefore, FFTs are performed on the additional data only, and the RIO measured from this data is averaged with the RIO measured after the early-bail stage. The resultant RIO value is then compared to the previous best value of RIO, RIO*. If the difference, RIO-RIO*, exceeds the normal threshold, which in one embodiment is 0.75 dB, no further computations are performed, the parameter change is discarded, and the step-sizes are modified accordingly. If the difference is not greater than the threshold, the data passes into the final, or "verification," stage.

The verification stage looks at the complete power control group. This translates into 512 FFT averages. However, due to the nature of the multistage process, three fewer FFTs are performed because certain data samples at the start and at the end of a given stage do not contribute to the second FFT specified by the overlap of fifty percent. If the thirty-two samples at the end of a given stage are reloaded in computing the first FFT for the next stage, two FFTs may be recovered. However, the benefit of the two additional FFTs is negligible, rendering such reloading unnecessary. At the verification stage, the difference between the measured RIO and the best RIO, RIO*, is compared to a threshold of zero. If the RIO is seen to have improved, then the parameter change is kept; otherwise, the parameter change is discarded.

The multistage decision process yields two advantages. First, the average number of FFTs computed is reduced. Certain parameter modifications may be obviously bad, and a decision may be made sooner without significant computation. Second, more robust RIO measurements may be obtained. The variability of the peak-to-average ratio of the CDMA envelope implies that some segments of data, especially shorter ones, may not always contain peaks of a certain magnitude. As the nonlinearity of the HPA 106 is often more dramatic at higher input powers, particularly as saturation is approached, variability in the RIO measurement will be strongly correlated to the variability of the peaks. Thus, by increasing the number of FFTs performed, larger data is observed and variation is reduced. Additionally, regardless of the variability of the waveform, more averages reduce the variance of any measurement.

In the decision block 116, the effectiveness of the current predistortion functions is assessed. The RIO that has been measured is compared with the previous "best" value of RIO, denoted RIO*. If $RIO_j$ is seen to improve (i.e., if $RIO_j$ becomes more negative or reflects a reduction in out-of-band emissions), the current parameter set, {p'}, becomes the initial parameter set for the next iteration, $\{p\}|_{j+1}$, i.e., the predistortion step made is kept. Additionally, the measured value, $RIO_j$, becomes the new "best" value of RIO, RIO*. No changes are made to the step-sizes, {s}, or the sign of the step-size.

If RIO is found to be worse than RIO*, the initial parameter set for the next iterations remains $\{p\}|_j$. Advantageously, this decision branch may occur at any stage of the RIO measurement process. In addition, the algorithm seeks to adapt step-sizes in such a manner that incorrect modifications vary RIO by only ΔdB. Therefore, if the RIO variation from the previous best measurement ($RIO_j$-RIO*) is greater than Δ, the step-size of the modified coefficient, $s_i$, is divided by the constant factor, ξ. Likewise, if the specified difference is smaller than Δ, then the step-size is multiplied the factor ξ. Logically, the step-sizes will be bounded by the maximum predistortion gain and phase that is allowed, namely, 6 dB and π/2 radians, respectively. This adapting step-size algorithm causes the step-sizes to converge in such a manner that modifications in the parameters result in jumps in the level of the RIO that are on the order of Δ dB when the routine is in convergence. Further, the variation of the step-sizes prevents the algorithm from using only a fixed grid of points in the 2N-dimensional parameter space. Additionally, as an improvement in RIO was not found, the sign of the step-size flips. In other words, the next time the algorithm modifies the $i^{th}$ coefficient, it will take a step in the opposite direction.

As those of skill in the art would understand, the predistortion algorithm described herein need not be restricted to one precise set of software instructions, but could be modified while retaining features of the instant invention. Similarly, software instructions for the predistortion algorithm need not be limited to a specific programming language.

Thus, a novel and improved predistortion technique for high power amplifiers has been described. Those of skill in the art would understand that while the embodiments described herein relate to a cellular telephone system, many features of the instant invention lend themselves equally well to application in a satellite communication system, or in a point-to-point wireless system. Moreover, while the embodiments described herein relate to the forward-link RF waveform transmitted from a BTS to a mobile unit, those skilled in the art would appreciate that the principles of the invention could be incorporated into a mobile unit for application to a reverse-link RF waveform. It would further be understood by those of skill in the art that the embodiments disclosed herein relate not only to voice communication, but also to high-data-rate (HDR) data communication such as described in, e.g., TIA/EIA IS-95B.

Preferred embodiments of the present invention have thus been shown and described. It would be apparent to one of ordinary skill in the art, however, that numerous alterations may be made to the embodiments herein disclosed without departing from the spirit or scope of the invention. Therefore, the present invention is not to be limited except in accordance with the following claims.

What is claimed is:

1. A method of reducing out-of-band emissions from an amplifier, the method comprising the steps of:

multiplying a digital input signal to the amplifier with a set of digital predistortion parameters;

measuring the output power level of the out-of-band emissions from the amplifier;

measuring the output power level of the in-band emissions from the amplifier;

determining a current ratio of the in-band emissions to the out-of-band emissions; and adjusting the set of digital predistortion parameters based upon the current ratio.

2. The method of claim 1, further comprising the step of modifying the set of digital predistortion parameters to prevent the adjusting step from altering the average power level of the digital input signal.

3. The method of claim 2, wherein the modifying step comprises iteratively applying a power correction factor.

4. The method of claim 2, wherein the measuring, adjusting, and modifying steps are performed by a processor executing a set of software instructions.

5. The method of claim 1, further comprising the step of writing the set of digital predistortion parameters to a lookup table.

6. The method of claim 5, further comprising the step of interpolating between values in the lookup table.

7. The method of claim 6, wherein the interpolating step comprises executing a spline interpolation function.

8. The method of claim 1, wherein measuring the output power level of the out-of-band emissions from the amplifier comprises performing at least one stage of Fast Fourier Transform averages on digital samples of the output power level of the amplifier.

9. The method of claim 1, wherein measuring the output power level of the out-of-band emissions from the amplifier comprises performing a plurality of stages of iterative Fast Fourier Transform averages on digital samples of the output power level of the amplifier.

10. The method of claim 1, wherein the adjusting step comprises:

comparing the current ratio to at least one previous ratio of in-band emissions to out-of-band emissions; and adjusting the set of digital predistortion parameters based upon the at least one previous ratio if the current ratio is less than the at least one previous ratio.

11. The method of claim 1, further comprising the step of initializing the set of digital predistortion parameters, wherein the set of digital predistortion parameters includes gain parameters and phase parameters.

12. The method of claim 1, wherein the adjusting step comprises incrementing each digital predistortion parameter by a step, the step size being derived from the difference between a result obtained from measuring the output power level of the out-of-band emissions from the amplifier and a previous result obtained from measuring the output power level of the out-of-band emissions from the amplifier.

13. The method of claim 12, further comprising the step of iteratively adapting the step size based upon the degree of difference between the result and the previous result.

14. The method of claim 1, further comprising the steps of converting the digital input signal to an analog input signal, upconverting the analog input signal to a carrier frequency, downconverting the output power level, and digitally sampling the downcoverted output power level.

15. A device for reducing out-of-band emissions from an amplifier, comprising:

means for multiplying a digital input signal to the amplifier with a set of digital predistortion parameters;

means for measuring the output power level of the out-of-band emissions from the amplifier;

means for measuring the output power level of the in-band emissions from the amplifier;

means for determining a ratio of the out-of-band emissions to in-band emissions; and means for adjusting the set of digital predistortion parameters based upon the ratio.

16. The device of claim 15, further comprising means for modifying the set of digital predistortion parameters to prevent the adjusting step from altering the average power level of the digital input signal.

17. The device of claim 16, wherein the means for modifying comprises means for iteratively applying a power correction factor.

18. The device of claim 16, wherein the means for measuring, means for adjusting, and means for modifying comprise a processor and a plurality of software instructions.

19. The device of claim 15, further comprising means for writing the set of digital predistortion parameters to a lookup table.

20. The device of claim 19, further comprising means for interpolating between values in the lookup table.

21. The device of claim 15, wherein the means for measuring the output power level of the out-of-band emissions from the amplifier comprises means for performing at least one stage of Fast Fourier Transform averages on digital samples of the output power level of the amplifier.

22. The device of claim 15, wherein the means for measuring the output power level of the out-of-band emissions from the amplifier comprises means for performing a plurality of iterative Fast Fourier Transform averages on digital samples of the output power level of the amplifier.

23. The device of claim 15, further comprising:

means for comparing the ratio to at least one previous ratio of in-band emissions to out-of-band emissions.

24. The device of claim 15, further comprising means for initializing the set of digital predistortion parameters, wherein the set of digital predistortion parameters includes gain parameters and phase parameters.

25. The device of claim 15, wherein the means for adjusting comprises means for incrementing each digital predistortion parameter by a step, the step size being derived from the difference between a first result generated from the means for measuring the output power level of the out-of-band emissions from the amplifier and a second result previously generated from the means for measuring the output power level of the out-of-band emissions from the amplifier.

26. The device of claim 25, further comprising means for iteratively adapting the step size based upon the degree of difference between the first result and the second result.

27. The device of claim 25, further comprising means for converting the digital input signal to an analog input signal, means for upconverting the analog input signal to a carrier frequency, means for downconverting the output power level, and means for digitally sampling the downcoverted output power level.

28. An apparatus for reducing out-of-band emissions from an amplifier, the apparatus comprising:

means for multiplying a digital input signal to the amplifier with a set of digital predistortion parameters;

means for measuring the output power level of the out-of-band emissions from the amplifier;

means for measuring the output power level of the in-band emissions from the amplifier;

means for determining a current ratio of the in-band emissions to the out-of-band emissions; and means for adjusting the set of digital predistortion parameters based upon the current ratio.

* * * * *